US010090393B2

(12) United States Patent
Demuynck et al.

(10) Patent No.: US 10,090,393 B2
(45) Date of Patent: Oct. 2, 2018

(54) METHOD FOR FORMING A FIELD EFFECT TRANSISTOR DEVICE HAVING AN ELECTRICAL CONTACT

(71) Applicant: IMEC VZW, Leuven (BE)

(72) Inventors: Steven Demuynck, Aarschot (BE); Zheng Tao, Heverlee (BE); Boon Teik Chan, Leuven (BE); Liesbeth Witters, Lubbeek (BE); Marc Schaekers, Heverlee (BE); Antony Premkumar Peter, Heverlee (BE); Silvia Armini, Heverlee (BE)

(73) Assignee: IMEC VZW, Leuven (BE)

( * ) Notice: Subject to any disclaimer, the term of this patent is extended or adjusted under 35 U.S.C. 154(b) by 85 days.

(21) Appl. No.: 15/345,782

(22) Filed: Nov. 8, 2016

(65) Prior Publication Data
US 2017/0141199 A1 May 18, 2017

(30) Foreign Application Priority Data
Nov. 18, 2015 (EP) .................... 15195235

(51) Int. Cl.
H01L 29/417 (2006.01)
H01L 21/311 (2006.01)
(Continued)

(52) U.S. Cl.
CPC .... *H01L 29/41791* (2013.01); *H01L 21/0217* (2013.01); *H01L 21/0228* (2013.01);
(Continued)

(58) Field of Classification Search
None
See application file for complete search history.

(56) References Cited

U.S. PATENT DOCUMENTS 6,524,952 B1    2/2003  Srinivas et al.
2013/0065371 A1  3/2013  Wei et al.
(Continued)

FOREIGN PATENT DOCUMENTS

KR   10-2010-0107228 A   10/2010

OTHER PUBLICATIONS

European Search Report, European Patent Application No. 15195235. 5, dated Apr. 26, 2016, 10 pages.

*Primary Examiner* — Angel Roman
(74) *Attorney, Agent, or Firm* — McDonnell Boehnen Hulbert & Berghoff LLP

(57) ABSTRACT

A method for fabricating a semiconductor structure is provided. The method includes providing a patterned substrate comprising a semiconductor region and a dielectric region. A conformal layer of a first dielectric material is deposited directly on the patterned substrate. A layer of a sacrificial material is deposited overlying the conformal layer of the first dielectric material. The sacrificial material is patterned, whereby a part of the semiconductor region remains covered by the patterned sacrificial material. A layer of a second dielectric material is deposited on the patterned substrate, thereby completely covering the patterned sacrificial material. A recess is formed in the second dielectric material by completely removing the patterned sacrificial material. The exposed conformal layer of the first dielectric material is removed selectively to the semiconductor region.

19 Claims, 11 Drawing Sheets

(51) Int. Cl.
*H01L 29/45* (2006.01)
*H01L 21/02* (2006.01)
*H01L 21/285* (2006.01)
*H01L 21/3105* (2006.01)
*H01L 21/768* (2006.01)
*H01L 29/08* (2006.01)
*H01L 29/66* (2006.01)
*H01L 29/78* (2006.01)

(52) U.S. Cl.
CPC .. *H01L 21/02115* (2013.01); *H01L 21/02123* (2013.01); *H01L 21/02164* (2013.01); *H01L 21/02178* (2013.01); *H01L 21/02186* (2013.01); *H01L 21/28518* (2013.01); *H01L 21/28556* (2013.01); *H01L 21/31053* (2013.01); *H01L 21/31111* (2013.01); *H01L 21/76802* (2013.01); *H01L 21/76843* (2013.01); *H01L 21/76877* (2013.01); *H01L 21/76886* (2013.01); *H01L 29/0847* (2013.01); *H01L 29/45* (2013.01); *H01L 29/66795* (2013.01); *H01L 29/785* (2013.01)

(56) References Cited

U.S. PATENT DOCUMENTS

| | | |
|---|---|---|
| 2014/0191314 A1 | 7/2014 | Wang et al. |
| 2014/0312395 A1 | 10/2014 | Cheng et al. |
| 2015/0137194 A1 | 5/2015 | Wei |
| 2015/0137271 A1 | 5/2015 | Cai et al. |
| 2015/0235897 A1 | 8/2015 | Fu et al. |
| 2015/0294863 A1 | 10/2015 | Nemani et al. |
| 2016/0079248 A1* | 3/2016 | Basker ............ H01L 29/0692 257/347 |
| 2016/0093614 A1* | 3/2016 | Cheng ............ H01L 27/0886 257/401 |

* cited by examiner

METHOD FOR FORMING A FIELD EFFECT TRANSISTOR DEVICE HAVING AN ELECTRICAL CONTACT

CROSS-REFERENCE

This application claims priority from European patent application no. EP 15195235.5, filed on Nov. 18, 2015, which is incorporated by reference in its entirety.

TECHNICAL FIELD OF THE DISCLOSURE

The present disclosure is related to the formation of a field effect transistor device having an electrical contact. The main application can be fin-type field effect transistor devices.

BACKGROUND OF THE DISCLOSURE

As the transistor sizes are reducing in pursuit of Moore's law, increase in series resistance towards the channel is becoming a challenge. This is due to the fact that the performance of the device, such as for example, sub-threshold slope (SS), drain induced barrier lowering (DIBL) and drain saturation current ($I_{Dsat}$) can adversely be influenced if the series resistance is not minimized. This has to do mainly with the increase in contact resistance, which is one of the main components of the series resistance.

Contact resistance is a function of the resistance of (1) contact metal fill, (2) interface metal/semiconductor resistivity and (3) contact area.

1. Resistance of the fill metal can depend on whether the material needs to be integrated with contact liners and what the contribution of these contact liners is to the overall resistance.

2. Metal/semiconductor resistivity can be a function of the number of active dopants at the interface and the choice of interface metal. In pursuit of Moore's Law, alternative material choices can be introduced instead of silicon, such as strained silicon (s-Si), strained germanium (s-Ge) SiGe, or III-V compound semiconductor materials, to form the channel of a field effect transistor (FET)

In this respect, the choice of interface metal may depend on the type of material in the source and drain (S/D) region of the FET, which is chosen among the aforementioned alternative materials to be integrated for nMOS and pMOS, respectively. Additionally, the formation and thermal stability of the electrical contact as a function of the choice of the interface metal can also play a role.

Additionally, with the device scaling in pursuit of Moore's Law, introduction of new FET designs such as fin-type FET (finFET) or Tri-gate FET has taken place. Thus, there is a trend to integrate taller fin structures at tighter pitch to maximize drive current per footprint (accelerated by fin depopulation considerations). This can lead to reduction in the contact area, which in turns can lead to an increase in contact resistance. Besides, in relation with the influence of contact area, contact opening can also be critical since the damage on the S/D region of the FET within the contact area is typically created during contact opening. Damage to the S/D region can risk altering the number of active dopants, which in turn can influence the aforementioned metal/semiconductor resistivity thus, and can result in an increase in contact resistance.

There is, therefore, a need for a method that can enable the formation of an electrical contact on or completely surrounding the source region and drain region of a FET without resulting in damage to the substrate in the source/drain region; thus can lead to an electrical contact having minimized contact resistance.

SUMMARY OF THE DISCLOSURE

It is an object of the present disclosure to provide a method for fabricating a semiconductor structure.

It is an object of the embodiments of the present disclosure that the method can allow fabrication of a semiconductor structure that has an undamaged source region or drain region.

It is another object of the embodiments of the present disclosure that the method can allow production of a semiconductor structure that can be suitable for fabricating FETs particularly requiring doping concentration of at least $1 \times 10^{20}/cm^3$ in the source region or drain region.

It is another object of the embodiments of the present disclosure that the method can allow formation of an electrical contact with reduced contact resistance on source region or drain region, thanks to the undamaged source region or drain region.

It is another object of the embodiments of the present disclosure that the method can allow formation of an electrical contact, which can be conformal and can contact the entire source region or drain region such that the electrical contact can be formed not only at the top but also laterally on the side of the source region or drain region.

It is another object of the embodiments of the present disclosure that the method can allow carrying out the high-k last replacement metal gate (HKL-RMG) module after contact hole opening and electrical contact formation therein. This can diminish the problem of damaging the alignment markers. Damaging the alignment markers may typically occur when HKL-RMG is carried out before opening the contact hole and forming the electrical contact.

The above objectives can be accomplished by a method according to the present disclosure.

In a first aspect, the present disclosure relates to a method for fabricating a semiconductor structure. The method comprises providing a patterned substrate comprising a semiconductor region and a dielectric region. Directly on the patterned substrate a conformal layer of a first dielectric material can be deposited. The deposited conformal layer of a first dielectric material can thereby cover the semiconductor region and the dielectric region. A layer of a sacrificial material can be deposited on the conformal layer of the first dielectric material. The sacrificial material can be patterned, whereby at least a part of the semiconductor region can remain uncovered by the patterned sacrificial material. A layer of a second dielectric material can be deposited on the patterned substrate that completely covers the patterned sacrificial material. An excess portion of the second dielectric material can be removed by performing a surface flattening process, thereby exposing a top surface of the patterned sacrificial material. A recess can be formed in the second dielectric material by completely removing the patterned sacrificial material selectively to the conformal layer. Complete removal of the patterned sacrificial material can expose the conformal layer of the first dielectric material at the bottom of the recess. The exposed conformal layer of the first dielectric material can be removed selectively to the semiconductor region. This selective removal can at least expose the part of the semiconductor region.

In embodiments, patterning the sacrificial material may comprise providing a patterned photoresist layer on the sacrificial material. The patterned photoresist layer may be defined by photoresist features separated by apertures, whereby the apertures expose the sacrificial material. The sacrificial material can be dry plasma etched using the patterned photoresist layer as mask. After completion of the dry plasma etching, patterned photoresist layer can be removed by performing a photoresist strip process.

In embodiments, removing the exposed conformal layer of the first dielectric material selectively to the semiconductor region may be done by performing a wet etching process.

In embodiments, removing the exposed conformal layer of the first dielectric material selectively to the semiconductor region may also be done by subjecting the semiconductor structure to a vapor treatment.

In embodiments of the present disclosure, removal of the exposed conformal layer of the first dielectric material by performing the wet etching process or the vapor treatment can avoid creating damages on the semiconductor region from which it is removed.

In embodiments, the sacrificial material may be an amorphous carbon material or an amorphous silicon material.

It some embodiments of the present disclosure, the amorphous carbon material or the amorphous silicon material can have good etch selectivity with respect to the first dielectric material.

In embodiments, the depositing of the conformal layer of the first dielectric material may be done by Atomic Layer Deposition (ALD).

In some embodiments of the present disclosure, the ALD can provide a conformal layer of the first dielectric material on the patterned substrate. Furthermore, thickness of the first dielectric material deposited by ALD may be in the range of 1 nm to 10 nm, usually in the range of 1 nm to 5 nm.

In embodiments, the exposed part of the semiconductor region may be a part of a source region or of a drain region of a field effect transistor (FET).

In embodiments, the present disclosure relates to a method for forming an electrical contact to a semiconductor structure. The method comprises providing a semiconductor structure fabricated according to any embodiments of the present disclosure.

In embodiments, the semiconductor structure may comprise a patterned substrate. The patterned substrate may comprise a semiconductor region and a dielectric region. A layer of a second dielectric material may be overlaying on the patterned substrate. The second dielectric material can have a recess that exposes a part of the semiconductor structure.

In embodiments, the exposed part of the semiconductor structure may be a part of the semiconductor region.

In embodiments, the exposed part of the semiconductor region may be a part of a source region or a drain region of a field effect transistor (FET).

In embodiments, the field effect transistor may be a fin-type field effect transistor (finFET). The finFET may comprise structures having lateral walls and a top surface that protrude from the dielectric material. These protruding structures can be fin structures.

In embodiments, the semiconductor structure may further comprise a conformal layer of a first dielectric material which can be present on an un-exposed part of the semiconductor structure. The un-exposed part of the semiconductor structure can be overlaid by the second dielectric material.

A self-assembled monolayer (SAM) material may be selectively applied on the second dielectric material and on an exposed part of the dielectric region of the semiconductor structure, whereby the exposed part of the semiconductor region can remain uncovered. The electrical contact can be formed on the exposed part of the semiconductor region at the bottom of the recess. In an embodiment, the electrical contact may be a conformal electrical contact. SAM material can be selectively removed from the semiconductor structure.

In some embodiments of the present disclosure, selective application of the SAM material can allow for the formation of the electrical contact selectively on the exposed semiconductor region, which may not be covered by the SAM material. This can remove the need for carrying out an additional chemical mechanical planarization step, which could otherwise be required to remove the metal from the field areas that are outside the recess.

In embodiments, forming the electrical contact may further comprise depositing a contact metal overlaying the semiconductor structure filling in the recess. The contact metal can be a contact metal fill.

In embodiments, forming the electrical contact may comprise selectively depositing a metal on the exposed part of the semiconductor region at the bottom of the recess. A vapor-solid reaction can be performed, whereby the semiconductor structure can be subjected to a silicon-comprising precursor gas or a germanium comprising precursor gas thereby converting the metal to respectively a metal silicide or a metal germanide.

In some embodiments of the present disclosure, the formation of the electrical contact does not depend on the materials choice of the exposed semiconductor region, on which the metal is deposited.

In some embodiments of the present disclosure, it can allow the formation of the electrical contact without consuming the material of the exposed semiconductor region, thanks to the vapor-solid reaction.

In embodiments, forming the electrical contact may also comprise depositing a layer stack by using an ALD process. The layer stack may comprise a metal layer in contact with the exposed part of the semiconductor region at the bottom of the recess and a metal nitride layer on and in contact with the metal layer.

In embodiments, the metal may be titanium (Ti). Ti can be a good oxygen getter.

In embodiments, the metal nitride may be titanium nitride (TiN). TiN can form a good interface between Ti and the contact metal.

In embodiments, the electrical contact may be a wrap-around contact.

In some embodiments of the present disclosure, the wrap-around contact can allow for contacting the exposed semiconductor region from all sides. Contacting the exposed semiconductor region from all sides can maximize the contact area, thereby minimizing contact resistance.

DETAILED DESCRIPTION OF THE DISCLOSURE

Figure 1A:
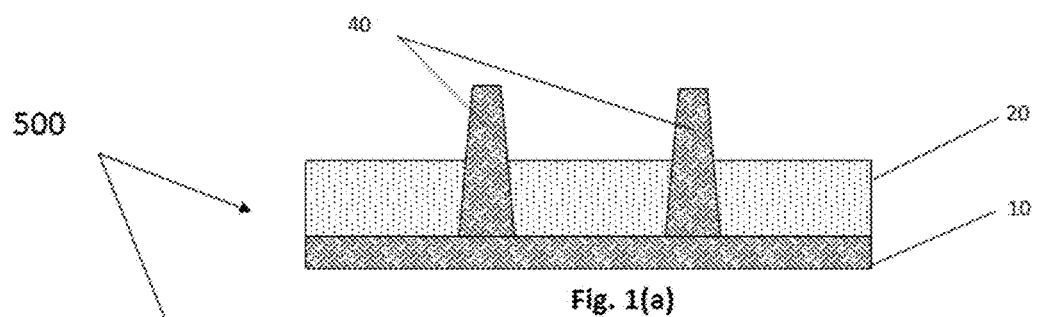
FIG. 1(a) is a schematic cross section view and FIG. 1(b) and FIG. 1(c) are schematic tilted views of a patterned substrate comprising on a main surface a semiconductor region and a dielectric region.

The present disclosure can be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions may not correspond to actual reductions to practice of the disclosure.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout the specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout the specification are not necessarily all referring to the same embodiment, but may. Furthermore, the particular features, structures or characteristics may be combined in any suitable manner, as would be apparent to one of ordinary skill in the art from the disclosure, in one or more embodiments.

Similarly it should be appreciated that in the description of exemplary embodiments of the disclosure, various features of the disclosure may sometimes be grouped together in a single embodiment, figure, or description thereof for the purpose of streamlining the disclosure and aiding in the understanding of one or more of the various inventive aspects. The method of disclosure, however, is not to be interpreted as reflecting an intention that the claimed disclosure requires more features than are expressly recited in each claim. Rather, as the following claims reflect, inventive aspects can lie in less than all features of a single foregoing disclosed disclosure and are hereby expressly incorporated into the detailed description, with each claim standing on its own as a separate embodiment of the disclosure.

Furthermore, while some embodiments described herein can include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of the description.

The following terms are provided solely to aid in the understanding of the disclosure.

As used herein and unless provided otherwise, the term "self-assembled monolayer (SAM) material" can refer to molecular assemblies that form on the surfaces spontaneously by adsorption and are organized into more or less large ordered domains. SAM materials may possess a head group with a strong affinity to the substrate, a tail group and a functional end group. SAM materials can be created by the chemisorption of the head groups onto the substrate from vapor or liquid phase followed by slow organization of the tail groups.

As used herein and unless provided otherwise, the term "electrical contact" can refer to a contact made on an area of a conducting or a semiconducting material.

As used herein and unless provided otherwise, the term "technology node" can refer to devices in semiconductor processing having a gate length at the indicated number such as, for example, N10 which refers to technology node having a gate length of 10 nm.

As used herein and unless provided otherwise, the term "STI-last" can refer to planar deposition of a material on a substrate followed by patterning it to make the fin structures and filling in the space between the fin structures with a dielectric material.

As used herein and unless provided otherwise, the term "STI-first" can refer to the growth of fin structures in trenches made in a dielectric material, which can be provided on a substrate.

As used herein and unless provided otherwise, the term "contact resistance" can refer to the contribution to the series resistance of a field effect transistor, which can depend on the resistivity of the metal/semiconductor resistivity and the area through which the metal contacts the semiconductor.

As used herein and unless provided otherwise, the term "contact hole" can refer to a recess made in a dielectric material overlying a patterned substrate. A contact hole can expose a part of a source region or a drain region of a FET and can be filled with a contact metal fill to contact the source region or the drain region to an interconnect structure.

As used herein and unless provided otherwise, the term "having a material that has good etch selectivity with respect to another material" can refer to the etch rate of the material being higher than that of the another material given under prescribed etching conditions.

As used herein and unless provided otherwise, the term "conformal" can refer to being able to follow the topography of any surface.

As used herein and unless provided otherwise, the term "exposed" can refer to a layer, a surface or a region that can be in contact with surrounding atmosphere.

As used herein and unless provided otherwise, the term "un-exposed" can refer to a layer, a surface or a region that is not in contact with the surrounding atmosphere.

As used herein and unless provided otherwise, the term "etching a material selectively to another material" can imply that the material can be etched without etching the another material.

As used herein and unless provided otherwise, the term "oxygen getter" can refer to a material that can scavenge oxygen.

As used herein and unless provided otherwise, the term "wrap-around contact" can refer to an electrical contact that can cover a source and/or a drain region from all exposed sides. When the field effect transistor device is fin-type field effect transistor (Fin-FET), wrap around contact can refer to an electrical contact covering the top and part of the sidewalls of the fin structure, which define the source and/or drain region.

Figure 1B:
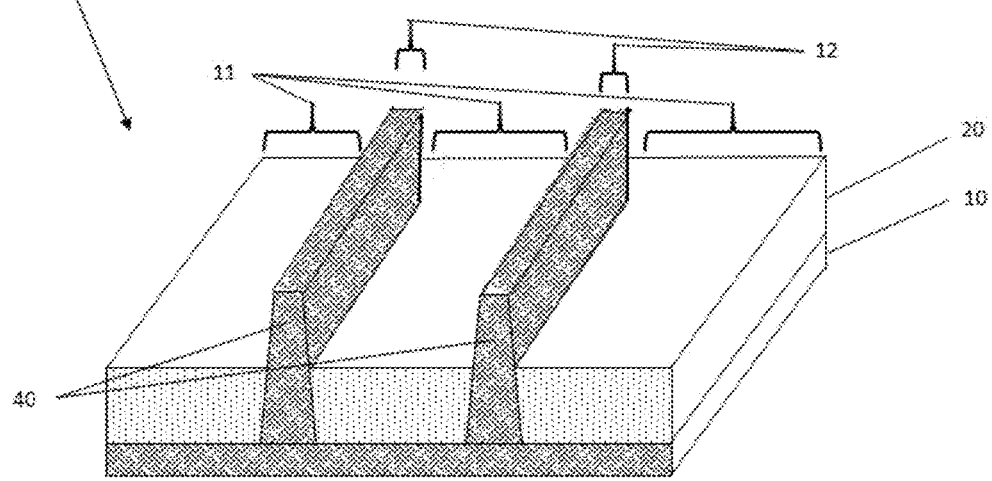

FIG. 1(a) shows a schematic cross section (500) and FIG. 1(b) shows a tilted view (501) of a patterned substrate. The patterned substrate (500, 501) comprises a semiconductor region (12) and a dielectric region (11).

The dielectric region (11) comprises a dielectric material (20), which is typically $SiO_2$, that is in contact with a semiconductor substrate (10). The semiconductor substrate (10) may be a Si or Ge substrate (10) such as a Si wafer or a Ge wafer. The semiconductor substrate may also be a silicon on insulator (SOI) or germanium on insulator (GeOI) substrate.

The semiconductor region (12) may comprise a plurality of structures having lateral walls and a top surface that protrude from the dielectric material (20). The plurality of structures are fin structures (40). As it may be understood by a person skilled in the art, the patterned substrate as illustrated in FIG. 1(a) and FIG. 1(b) may form the basis for forming a finFET device comprising the plurality of fin structures (40).

The patterned substrate (500, 501)) may be manufactured by using the Shallow Trench Isolation (STI) approach as known in semiconductor manufacturing. The dielectric material (20), which is $SiO_2$, can function as isolation material. Either STI-last or STI-first approach may be used as known in the art to produce the patterned substrate (500, 501) such as that shown in FIG. 1(a) or FIG. 1(b). The fin structures (40) may comprise a Group III-V compound semiconductor. The fin structures (40) may also comprise at least one element selected from the group consisting of Si and Ge.

The fin structures (40) may be doped with a dopant element at a desired doping concentration defined by the technology node in question. Doping of the fin structures can lead to the formation of an n-type or p-type channel depending on the type of the dopant element. The height and width of the fin structures may be defined by the choice of the technology node in question.

Alternatively (not shown in the figures), a top surface of the semiconductor region and a top surface of the dielectric region may be abutting on a same surface, such as for example in a planar FET device.

Figure 1C:
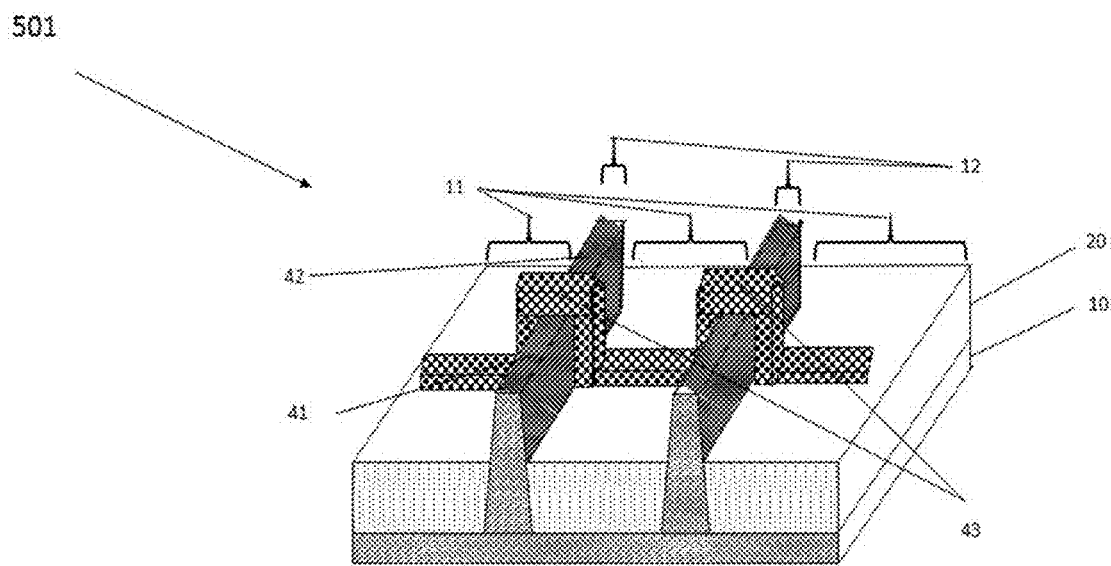

The fin structures (40) may comprise a gate stack (43) covering a channel region, and spacers (not shown in the figure), which embed the gate stack on both sides. The channel region can be located in between a source region (41) and a drain region (42) as shown in FIG. 1(c). The gate stack (43) may be a dummy gate stack comprising, for example, a thin layer of $SiO_2$ as the dummy gate dielectric (not shown in the figures) and amorphous silicon (a-Si) as the dummy gate metal.

One way of carrying out the source/drain formation module is such that the fin structures (40) in the source region (41) and the drain region (42) may be recessed followed by epitaxial regrowth. Thus, the epitaxially regrown source and drain in this fashion can be typically referred to as embedded source and drain and may be formed from the same semiconductor material as that of the fin structures, such for example a Ge fin and epitaxially regrown Ge on it. The epitaxially regrown source and drain may also be formed from a different semiconductor material, such for example a Ge fin and epitaxially regrown $Si_xGe_{1-x}$ on it. Epitaxial regrowth of the source/drain can proceed until the original height of the fin structures (40) is reached. In practice, how high the epitaxial re-regrown source/drain will be can be a free choice. For optimal connectivity into the extension region, regrowth can be done typically up to the original fin height. However, depending on the type of the epitaxial regrowth being epitaxial regrowth of Si or SiGe, the shape of the epitaxial regrown part might differ due to different growth rate along different crystallographic planes. As a result, SiGe can typically grow diamond shaped between gates, while the shape can be more of a triangular shape for Si. In-situ doping during epitaxial regrowth or doping after epitaxial regrowth by ion implantation may be performed. The doping may be done by using a suitable dopant element such as for example by using a p-type or an n-type dopant such that it can result in a highly-doped source/drain so as to minimize contact resistance. Contact resistance may already be a key contributor to device performance at state-of-the art N14 technology in semiconductor industry. Lowering the contact resistivity and increasing the contact area can allow for reducing the contact resistance. Typical doping concentration targeted for source/drain in technology nodes smaller than N10 in semiconductor manufacturing can be at least $1\times10^{20}/cm^3$. Typically a contact resistance value of sub 1e-9 Ohm·$cm^2$ can be targeted for N7 and N5 technology. This can be achieved with dopant concentrations exceeding 1e21 at/$cm^3$.

In an alternative approach to carry out source/drain formation module, epitaxial regrowth may take place directly on the fin structures (40). Thus, the epitaxially regrown source and drain in this fashion can be typically referred to as raised source and drain. In-situ doping or doping after regrowth may be performed in the same way as that of embedded source and drain formation module.

The shape of the epitaxially regrown source drain regions can depend on whether the epitaxial regrowth can take place freely or whether the regrowth is confined by a kind of spacer material in which case the epitaxial regrowth can only fill up the cavity created by fin recess.

The dummy gate stack (43) can be replaced with the actual gate stack that comprises a high-k dielectric material, as the gate dielectric, and a gate metal. This is called high-k last replacement metal gate module (HKL-RMG). Typically, this HKL-RMG takes place before opening the contact holes, which reach to the source and drain region through an interlayer dielectric.

It has been found that the method according to the embodiments of the present disclosure can enable carrying out the HKL-RMG after contact hole opening and electrical contact formation therein. When the replacement is done before contact opening and electrical contact formation, alignment markers may be damaged. Alignment markers can be used when consecutive lithography and etching processes are to be performed for patterning layers so that layers can be aligned in the intended way with respect to each other to end up with correct patterning. Damage to the alignment markers can further cause alignment problems for contact hole opening. It is thus, in some embodiments of the present disclosure, that postponing the replacement until after contact hole opening and contact formation can allow performing the correct alignment with respect to the a-Si dummy gate metal.

FIG. 2(a), FIG. 2(b), FIG. 2(c), FIG. 2(d), FIG. 2(e), FIG. 2(f), FIG. 2(g) and FIG. 2(h) show schematically fabricating a semiconductor structure according to embodiments of the present disclosure.

Figure 2A:
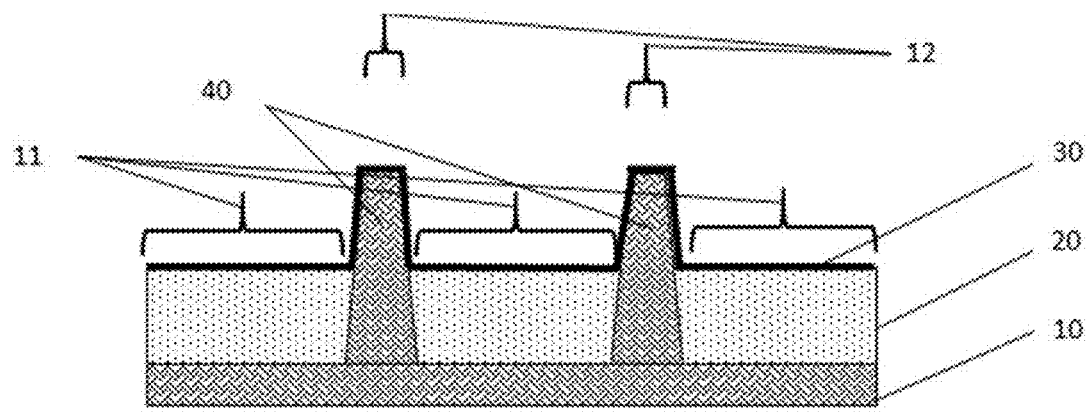
FIG. 2 (a)
FIG. 2(b), FIG. 2(c), FIG. 2(d), FIG. 2(e), FIG. 2(f), FIG. 2(g) and FIG. 2(h) show schematically fabricating a semiconductor structure according to embodiments of the present disclosure.

As illustrated in FIG. 2(a), a conformal layer of a first dielectric material (30) may be deposited directly on the patterned substrate (500, 501), thereby covering the semiconductor region (12) and the dielectric region (11).

In embodiments, the first dielectric material (30) may be a metal oxide, a silicon oxide or a silicon nitride.

In embodiments, the silicon nitride may be $Si_3N_4$.

In embodiments, the metal oxide may be an aluminum oxide or titanium oxide.

In some embodiments, the aluminum oxide may be $Al_2O_3$.

In some embodiments, the titanium oxide may be $TiO_2$.

In some embodiments, the first dielectric material may be the silicon oxide.

In some embodiments, the silicon oxide may be $SiO_2$.

In embodiments, the first dielectric material (30) may be deposited by using Atomic Layer Deposition (ALD), Chemical Vapor Deposition (CVD) or Low-Pressure Chemical Vapor Deposition (LP-CVD). As device scaling is on-going, in some embodiments, a thin layer of the first dielectric material can be deposited. Deposition of a thin layer of the first dielectric material can fill up the small gap between dense gate structures which gap may not be desired.

In some embodiments, the first dielectric material (30) may, therefore, be deposited by using ALD process, since it allows for depositing a conformal and thin layer on the patterned substrate (500, 501).

In embodiments, the thickness of the first dielectric material may be in the range of 1 nm to 5 nm.

Figure 2B:
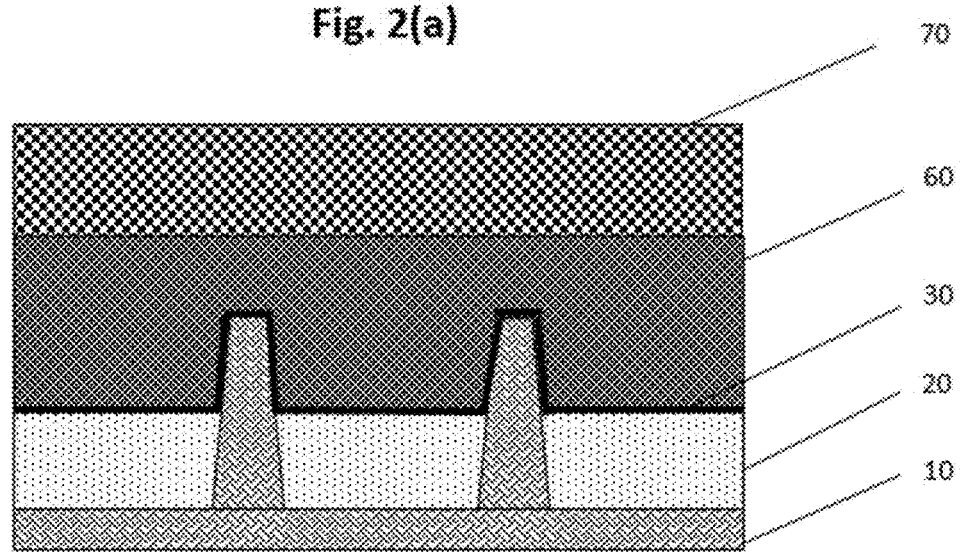

After the conformal deposition of the first dielectric material (30) on the patterned substrate (e.g. by using ALD process), a layer of a sacrificial material (60) can be deposited directly on the first dielectric material (30) (FIG. 2(b)). The sacrificial material can cover the surface of the patterned substrate and embed the fin structures (40) on all sides.

In embodiments, the sacrificial material (60) may be deposited by Plasma Enhanced Chemical Vapor Deposition (PE-CVD).

In embodiments, the sacrificial material (60) may be an amorphous carbon material or an amorphous silicon material.

Both the amorphous carbon material and the amorphous silicon material can be suitable as the sacrificial material owing to the fact that they can have good etch selectivity with respect to $SiO_2$ or $Si_3N_4$, which may be chosen as the conformal layer of the first dielectric material.

Figure 2C:
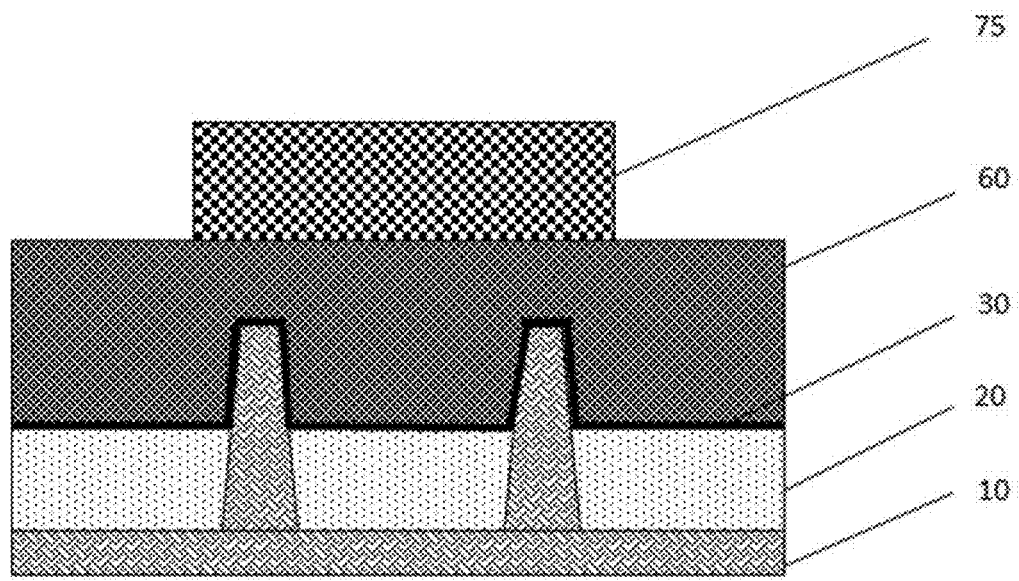
Figure 2D:
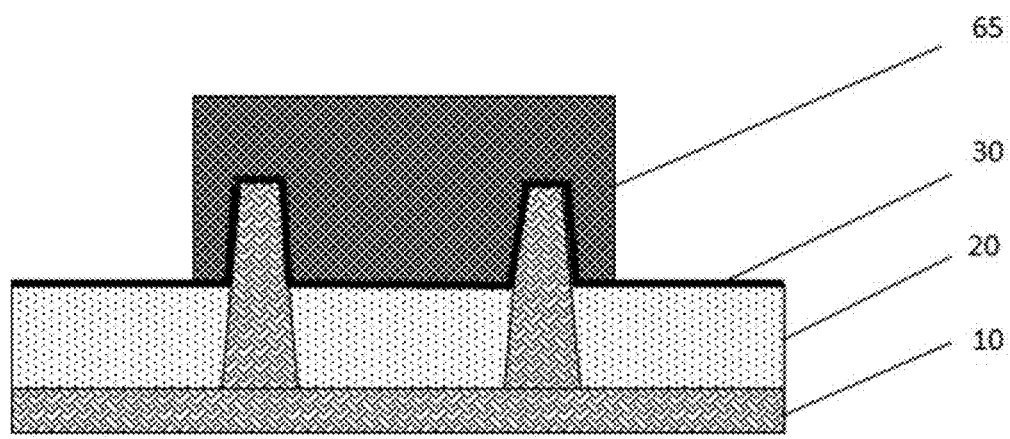
Figure 2E:
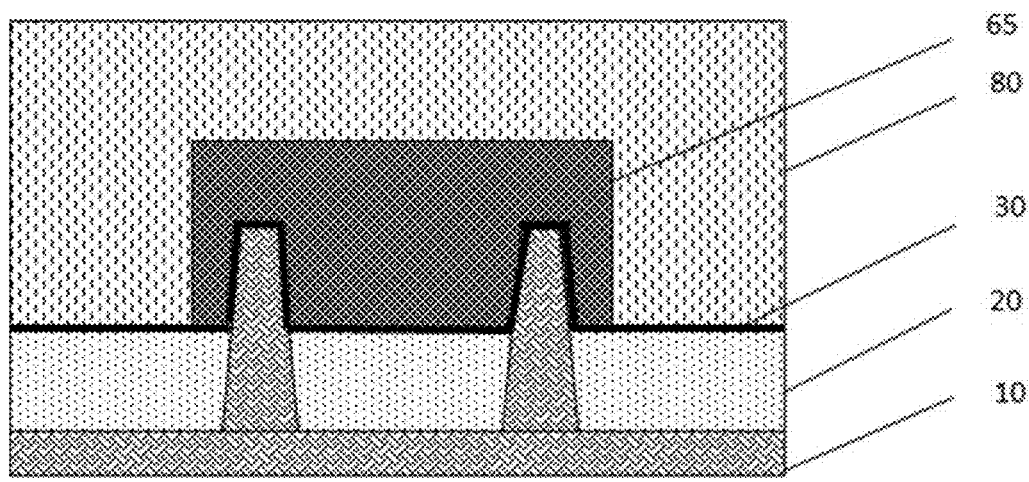
Figure 2F:
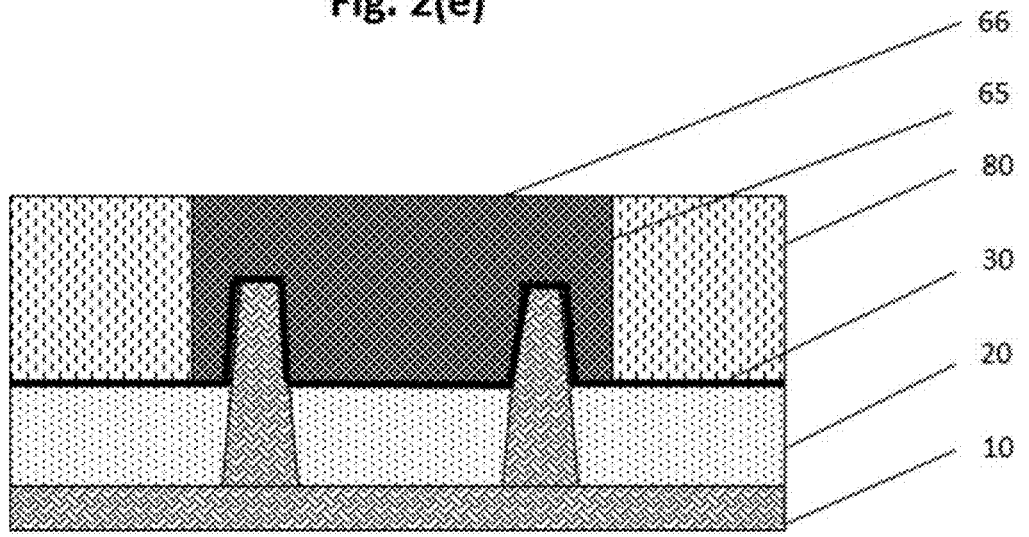
Figure 2G:
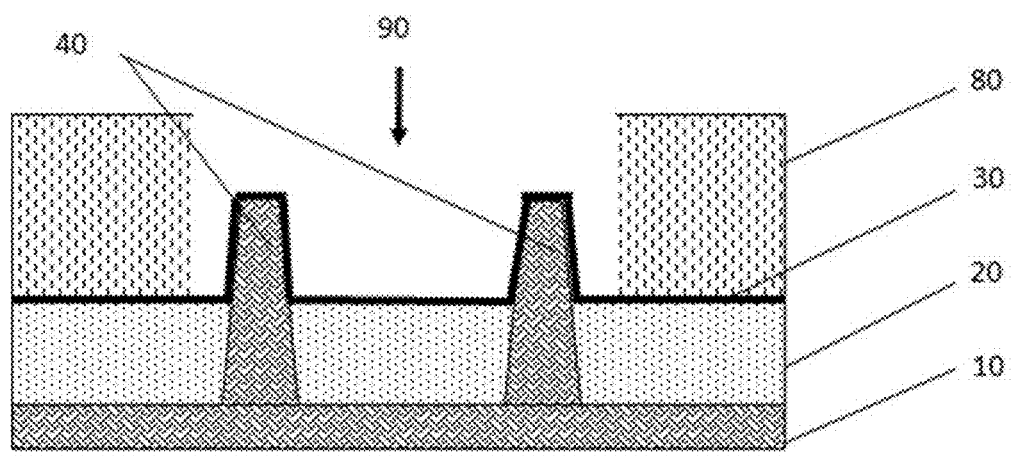
Figure 2H:
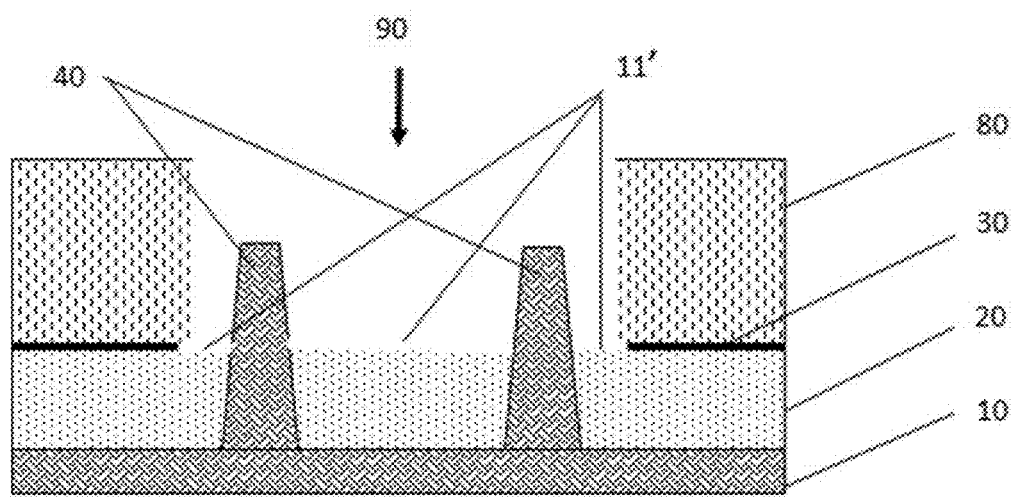

Patterning the sacrificial material (60) comprises providing a patterned photoresist layer (75) on the sacrificial material (60) (FIG. 2(c)). The sacrificial material (60) can then be dry plasma etched using the patterned photoresist layer (75) as a mask. After dry plasma etching is completed, patterned photoresist layer (75) can be removed (FIG. 2(d)). Patterning of the sacrificial material (60) can be done such that at least a part of the semiconductor region can remain covered by the patterned sacrificial material (65). Besides, dry plasma etching of the sacrificial material (60) can be selective to the conformal layer of the first dielectric material (30). This selective dry plasma etching process can allow the conformal layer of the first dielectric material (30) to still remain on the patterned substrate after patterning of the sacrificial material (60) is completed. An electrical contact (100) can be further formed on this part of the semiconductor region. More specifically, patterning of the sacrificial material (60) can be done such that a pattern (65) of the patterned sacrificial material that can be formed can correspond to or overlaps with an area of the patterned substrate that comprises a part of the semiconductor region on which an electrical contact (100) is to be formed.

Providing a patterned photoresist layer (75) can comprise depositing a photoresist layer (70) on the sacrificial material (60) (FIG. 2(b)), followed by exposure of the photoresist layer by performing a lithographic patterning process. The lithographic patterning process may be deep ultra violet (DUV), extreme ultra violet (EUV), or 193 nm immersion lithography.

A layer of a second dielectric material (80) can be deposited on the patterned substrate (FIG. 2 (e)). The second dielectric material (80) can completely embed the patterned sacrificial material (65) from lateral sides and from the top surface. The second dielectric material (80) may for instance be deposited by self-aligned chemical vapor deposition (SA-CVD), high density plasma chemical vapor deposition (HDP-CVD), flowable deposition or plasma enhanced atomic layer deposition (PE-ALD).

In embodiments, the second dielectric material (80) may be a silicon oxide.

In some embodiments, the silicon oxide may be $SiO_2$. The second dielectric material (80) can be typically referred to as interlayer dielectric zero (ILD0).

In some embodiments, the sacrificial material (60) may be an amorphous silicon material. Amorphous silicon as the sacrificial material (60) due to the fact that a high temperature treatment, such as above 600° C., can be used in order to densify the second dielectric material (80) after deposition. If Ge or SiGe is used as the channel material for p-MOS, a lower densification temperature of 550° C. or below down to room temperature can be used.

Amorphous silicon can be quite stable at high temperatures, such as above 600° C., for densification of the second dielectric material (80), which is $SiO_2$. In case when an amorphous carbon material would be used as the sacrificial material, it can risk being ashed out during $SiO_2$ densification which can be undesirable. Hence, amorphous carbon can be used when the second dielectric material is densified at a temperature of 550° C. or below. In embodiments, the amorphous carbon material may be an advanced patterning film (APF). The APF layer may be deposited at a temperature in the range of 400° C. to 550° C. Thus, if the densification of the second dielectric material may be facilitated at a temperature within or lower than this given range, then APF may be used as the sacrificial material since ashing out would be avoided.

In this embodiment, where amorphous silicon may be used as the sacrificial material (60), patterning of the sacrificial material may comprise providing a patterned photoresist layer (75) on the sacrificial material (60) FIG. 2(c)). The sacrificial material (60) can then be dry plasma etched using the patterned photoresist layer (75) as a mask. After dry plasma etching is completed, patterned photoresist layer (75) can be removed.

In alternative embodiments, where amorphous silicon may be used as the sacrificial material (60), patterning of the sacrificial material (60) may comprise providing a hard mask layer (not shown in the figures) sandwiched and in contact with the sacrificial material (60) and the photoresist layer (70). Resist masks can be typically soft, thin and they can shrink when subjected to an etch plasma, thus making them unreliable as a masking layer when dimensions are scaling. Therefore, in some embodiments, the hard mask as described can be used. After forming the patterned photoresist layer (75) by performing a lithographic process, the hard mask layer can be etched by performing a dry plasma etching process. Consequently, the patterned photoresist layer can be removed, thereby leaving a patterned hard mask layer on the sacrificial material (60). The patterned hard mask layer can be further used as a mask for dry plasma etching of the sacrificial material (60). Following the completion of dry plasma etching, the patterned hard mask layer can be removed.

According to these alternative embodiments, the hard mask layer may be a silicon oxide or a silicon nitride.

In some embodiments, the silicon oxide may be $SiO_2$.

Yet in other embodiments, the silicon nitride may be $Si_3N_4$.

It has been determined that depositing the conformal layer of the first dielectric material (30) directly on the patterned substrate (500, 501) according to embodiments of the present disclosure can help avoid the use of an ozone atmosphere. This may be due to the fact that some of the deposition techniques used to deposit the layer of the second dielectric material, which can be $SiO_2$, can involve a step where the substrate is subjected to an ozone atmosphere so as to initiate the deposition of $SiO_2$. Typically, for example, a self-aligned chemical vapor deposition process or a flowable oxide deposition process can involve ozone in the onset of deposition. This step involving ozone exposure may damage the semiconductor region, more specifically the fin structures (40), especially when the semiconductor region is made of Ge or is Ge-comprising. The damage can be created due to the oxidation of the Ge or Ge comprising semiconductor region, which can then become prone to removal in aqueous environment. Thus, presence of the conformal first dielectric material covering the surface of the semiconductor structure can prevent these damages from occurring.

A chemical mechanical planarization (CMP) process may be performed until a top surface (66) of the patterned sacrificial material (65) is revealed FIG. 2(*f*).

Following the CMP process, the patterned sacrificial material (65) can be removed completely and selectively to the conformal layer of the first dielectric material (30), thereby forming a recess (90) (FIG. 2(*g*)). The recess (90) may be referred to as a contact hole. The recess (90) can expose at its bottom the conformal layer of the first dielectric material (30) and the recess can have lateral walls comprising the second dielectric material (80). Removal of the patterned sacrificial material (65) may be done by performing a dry etch plasma process. Complete removal of the patterned sacrificial material (65) selectively to the conformal layer of the first dielectric material (30) can allow the semiconductor region masked by the patterned sacrificial material (65) not to be exposed to the chemistry used during the removal and therefore can still be protected.

In embodiments, where amorphous carbon may be used as the sacrificial material (60), removal may be done by subjecting the patterned substrate to a dry etch plasma comprising $O_2/N_2H_2$.

In some embodiments, where amorphous silicon may be used as the sacrificial material (60), removal of the patterned sacrificial material may be done by subjecting the semiconductor structure to a dry etch plasma comprising $HBr/Cl_2$. Alternatively, amorphous silicon may be easily removed by a wet etching process, whereby tetra methyl ammonium hydroxide (TMAH) can be used as the wet etch process liquid.

Subsequently, the exposed layer of the first dielectric material (30) at the bottom of the recess (90) can be removed selectively to the semiconductor region (FIG. 2(*h*)). As a result of this removal, at least a part of the semiconductor region (12) can be exposed.

In embodiments, the exposed part of the semiconductor region may be a part of a source region (41) or a drain region (42) of a field effect transistor (FET).

In some embodiments, the field effect transistor may be a fin-type field effect transistor (finFET). The finFET may comprise structures having lateral walls and a top surface that protrudes from the dielectric material (20) of the dielectric region (11) and these protruding structures can be fin structures (40). The source region or drain region may be comprised in the fin structures.

In embodiments, at the bottom of the recess (90), a part of the dielectric region (11) may also be exposed (11'). Thus, in these embodiments, at the bottom of the recess (90), the exposed part of the fin structures (40), may protrude from the dielectric material (20) of the exposed part (11') of the dielectric region (11).

In some embodiments, the first dielectric material (30) can be removed selectively to the semiconductor region (12) and this can allow diminished risk of damaging the semiconductor region.

In embodiments, removing the first dielectric material (30) selectively to the semiconductor region (12) may be done by performing a wet etching process.

In alternative embodiments, removing the first dielectric material (30) selectively to the semiconductor region (12) may be done by performing a vapor treatment process, whereby the semiconductor structure can be subjected to a vapor.

In some embodiments of the present disclosure, the first dielectric material (30) can be removed by performing a wet etching process or a vapor treatment process since the exposed semiconductor region may not be damaged by such a process. By contrast, using dry plasma etching for removal of the first dielectric material can have the potential to damage the semiconductor region.

The aluminum oxide or the titanium oxide can both be removed selectively to the semiconductor region by a wet etching process, whereby an ammonia-peroxide liquid mixture (APM) can be used as the wet etch process liquid.

The silicon nitride can be removed by a wet etching process, whereby hot phosphoric acid ($H_3PO_4$) may be used as the wet etch process liquid. However, use of hot ($H_3PO_4$) should be done in caution since it is a strong etchant and may thus cause damages on the substrate and lead to issues in terms of defectivity. On the other hand, in the case when a thin $Si_3N_4$ layer is deposited, for instance less than 5 nm, the thin $Si_3N_4$ layer may first be oxidized by methods known to persons skilled in the art. Subsequently, removal may be achieved by using a aqueous HF solution. Typically, a concentration of less than 1 volume % can be used in order to provide low and controllable etch rate. However, this may cause damages on the substrate as well such as, for example, irregular etching such as for example anisotropic etching.

The silicon oxide can be removed by a wet etching process, whereby a aqueous hydrogen fluoride (HF) can be used as the wet etch process liquid. Furthermore, the silicon oxide can also be removed by performing a vapor HF treatment.

In embodiments of the present disclosure, the first dielectric material (30) may be $SiO_2$ which can be easily removed by a wet etching process, whereby an aqueous HF solution can be used as the wet etch process liquid. Typically, a concentration of less than 1% volume can be used in order to provide low and controllable etch rate. In addition to being removed easily, silicon oxide can be used as the first dielectric material since it can be easily deposited on the semiconductor structure.

In some embodiments, the selective wet etching process can be done in order to remove the first dielectric material is such that the exposed part of the semiconductor region can be undamaged.

Thus, the dopant concentration within the exposed part of the semiconductor region can be kept substantially at the intended level that was achieved by doping during and/or after the source/drain formation module. This can result in a finFET device with minimized contact resistance.

Figures 3A, 3B:
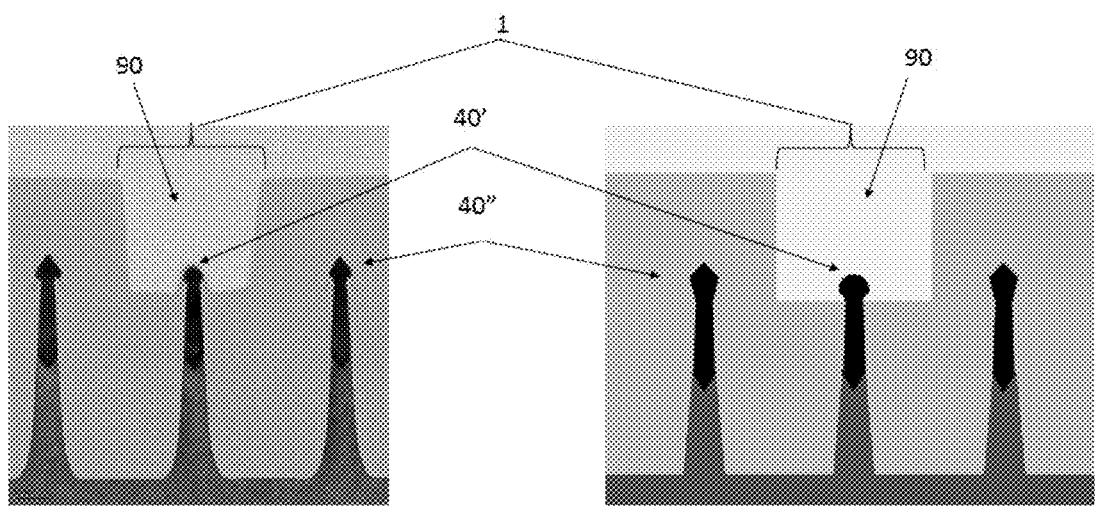
FIG. 3(a) is a cross section Transmission Electron Microscopy (TEM) image and FIG. 3(b) schematic representation of a semiconductor structure after formation of the recess.

FIG. 3(a) shows a cross section TEM image and FIG. 3(b) shows a schematic representation of a cross-section of the exposed part of the semiconductor region of a semiconductor structure that is damaged after a contact opening process is done to form the contact hole (90) according to conventional procedures. The typical contact opening process comprises depositing the second dielectric material (80) on the patterned substrate (500, 501). A patterned photoresist layer (75) is provided on the second dielectric material (80) comprising patterned photoresist features and apertures in between these patterned photoresist features (75). A contact hole (90) is formed by dry plasma etching through the second dielectric material (80) using the patterned photoresist layer as a mask. Subsequently, patterned photoresist layer is stripped from the semiconductor structure using a conventional process. Comparison of the profile of the fin structure (40') in the exposed part (1) of the semiconductor region (12) with that of another fin structure (40"), which is unexposed, shows that the prior (40') has a distorted profile due to the damage caused by the dry plasma etching process done in order to open the contact hole (90).

In some embodiments of the present disclosure, contrary to the aforementioned typical contact hole formation process, patterned photoresist features are not provided on the second dielectric material (80) in order to form the recess (90) in the second dielectric material (80) by etching through the second dielectric material (80) using the patterned photoresist features as a mask. Since usage of patterned photoresist features can be avoided on the second dielectric material (80), performing the strip process after formation of the contact hole (90) can become obsolete. Absence of the strip process after formation of the contact hole (90), in embodiments of the present disclosure, can be avoided. The strip process chemistry may potentially oxidize the exposed part of the semiconductor region. The oxidized layer can be susceptible to removal. Removal may then result in material loss from the exposed part of the semiconductor region and thus can lead to a change in the dopant concentration from the intended level that was achieved during and/or after the source/drain formation module by doping.

Figure 4:
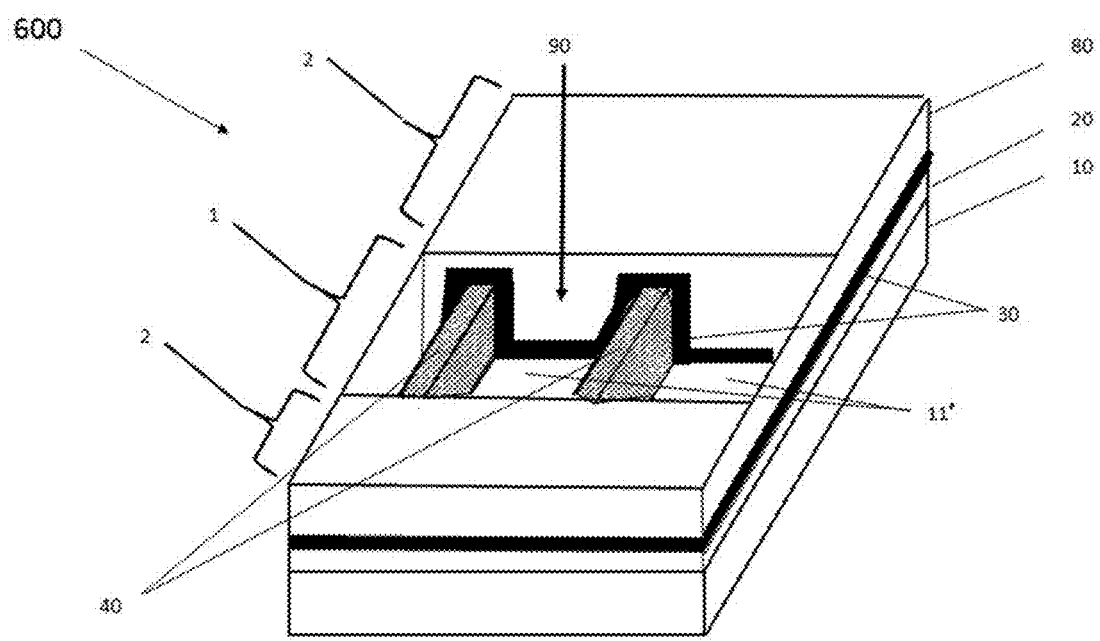
FIG. 4 shows a tilted view of a semiconductor structure fabricated according to embodiments of the present disclosure.

FIG. 4 shows a tilted view of a semiconductor structure (600) fabricated according to embodiments of the present disclosure.

The semiconductor structure (600) may comprise a patterned substrate (500, 501) that may comprise a semiconductor region and a dielectric region. A layer of a second dielectric material (80) can overlay the patterned substrate. The second dielectric material (80) can have a recess (90) that exposes a part of the semiconductor structure (600). The exposed part (1) of the semiconductor structure (600) may comprise at least a part of the semiconductor region.

In embodiments, the exposed part of the semiconductor region may be a part of a source region or a drain region of a field effect transistor (FET).

In some embodiments, the field effect transistor can be a fin-type field effect transistor (finFET). The finFET may comprise structures having lateral walls and a top surface that protrude from the dielectric material (20) and these protruding structures can be fin structures (40).

The semiconductor structure (600) may further comprise a conformal layer of a first dielectric material (30) present on an un-exposed part (2) of the semiconductor structure.

FIG. 5(a), FIG. 5(b), FIG. 5(c), FIG. 5(d), and FIG. 5(e) shows schematically the formation of an electrical contact to a semiconductor structure according to embodiments of the present disclosure.

A semiconductor structure (600) such as that represented schematically in FIG. 4 is provided. The semiconductor structure (600) may be fabricated according to embodiments of the present disclosure.

The semiconductor structure (600) may comprise a patterned substrate (500, 501) that may comprise a semiconductor region and a dielectric region. A layer of a second dielectric material (80) can overlay the patterned substrate. The second dielectric material (80) can have a recess (90) that exposes, at its bottom, a part (1) of the patterned substrate. The exposed part (1) of the semiconductor structure (600) may comprise at least a part of the semiconductor region.

In embodiments, at the bottom of the recess (90), the exposed part (1) of the semiconductor structure (600) may further comprise an exposed part (11') of the dielectric region (11).

In embodiments, the exposed part (1) of the semiconductor region may be a part of a source region or a drain region of a field effect transistor (FET).

In some embodiments, the field effect transistor can be a fin-type field effect transistor (finFET). The finFET may comprise structures having lateral walls and a top surface that protrude from the dielectric material (20) of the dielectric region (11) and these protruding structures can be fin structures (40). The source region or drain region are comprised in the fin structures.

In embodiments, at the bottom of the recess (90), the exposed part (1) of the semiconductor structure (600) may comprise the exposed part (11') of the dielectric region (11), and the exposed part of the fin structures (40), where the exposed part of the fin structures (40) can protrude from the exposed part (11') of the dielectric region (11). The semiconductor structure (600) may further comprise a conformal layer of a first dielectric material (30) present on an un-exposed part (2) of the patterned substrate.

In embodiments, the un-exposed part (2) of the semiconductor structure (600) may comprise an un-exposed part of the source region or drain region of a first fin structure that extends longitudinally along a direction from the exposed part of the (same) source region or (same) drain region comprised in the exposed part of the patterned substrate. Alternatively, the un-exposed part (2) of the semiconductor structure (600) may comprise an un-exposed part of the source region or drain region of a second fin structure that is displaced along a direction horizontally away from the first fin structure.

In some embodiments, the semiconductor structure (600) that the profile of the exposed part of the source region or the drain region of the first fin structure may substantially be the same as that of the un-exposed part of the source region or the drain region of the first or of the second fin structure.

A self-assembled monolayer (95) material may be selectively applied on the semiconductor structure (600).

Figure 5A:
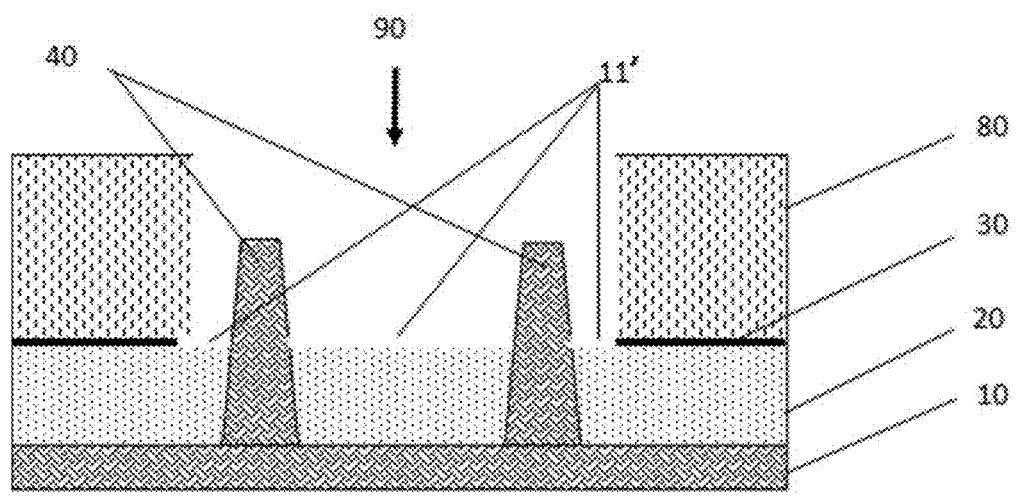
FIG. 5 (a)
FIG. 5(b), FIG. 5(c), FIG. 5(d), and FIG. 5(e) show schematically the formation of an electrical contact to a semiconductor structure according to embodiments of the present disclosure.
Figure 5B:
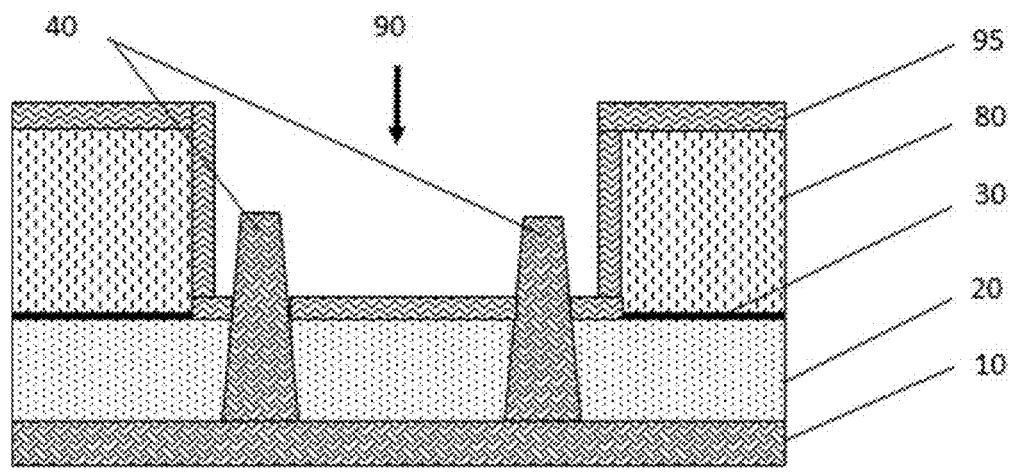

The self-assembled monolayer (95) can cover conformally the semiconductor structure (600), whereby the exposed part of the semiconductor region can remain uncovered (FIG. 5(b)). Selective application of the SAM material on the second dielectric material (80) and/or the exposed part of the dielectric region (11') of the semiconductor structure (600) can imply choosing a suitable SAM material such that its head group has an affinity to bind to the exposed surfaces of the second dielectric material (80) and/or the dielectric region. Therefore, in some embodiments of the present disclosure, the SAM material may be chosen such that its head group has an affinity to bind to $SiO_2$. Such a SAM material may be chosen from a group consisting of silanes which are typically selectively grafted to the Si—OH groups on the silicon oxide, or silicon nitride surface. By selecting —CH3 hydrophobic, non-reactive groups and long alkyl chain length of the silanes, such C10-C18, including C18 in one embodiment, a dense film may be formed which can inhibit ALD nucleation making the ALD deposition of the metal to be selective on the exposed part of the semiconductor region. Normally the alkyl trichloro or trialkoxy (methoxy or ethoxy) silanes (C10 to C18) may be deposited from the vapor phase or from organic solvents namely alcohols (i.e. ethanol, butanol, iso-propanol, propanol . . . ) or toluene in millimolar (mM) precursor concentration as known to persons skilled in the art.

It should be noted that in order to facilitate successfully the selective deposition of SAM material (95) only on the silicon oxide or silicon nitride and not on the exposed semiconductor region, the exposed semiconductor region should be cleaned such that the surface of the exposed semiconductor region becomes oxide free. Thus in one embodiment, the oxide, which is usually a native oxide as referred by persons skilled in the art, can be cleaned from the surface of the exposed semiconductor region prior to SAM material deposition.

In embodiments, this surface cleaning resulting in oxide removal may be done by a dry oxide removal process subsequently followed by in-situ vapor SAM deposition in the same process tool without air break.

In alternative embodiments, this surface cleaning resulting in oxide removal may be done by a wet oxide removal process subsequently followed by in-situ liquid SAM deposition in the same process tool without air break.

This in-situ SAM material deposition done either by depositing the SAM material from vapor phase or liquid phase, for instance, can result in the cleaned surface of the semiconductor region not being exposed to air, thus avoiding re-oxidation of the surface.

The SAM material, which can be deposited selectively on the second dielectric material (80) and/or exposed part (11') of the dielectric region (11) of the semiconductor structure (600), can be attached to the silicon oxide or silicon nitride through chemisorption.

It is also possible that SAM material may be deposited on the exposed part of the semiconductor region through physisorption. This physisorbed SAM layer should be removed from the exposed part of the semiconductor region before depositing the metal by ALD. Thus, a thermal annealing at a temperature lower than 400° C. may be done to remove physisorbed SAM material layer from the exposed part of the semiconductor region. In some embodiments, the thermal annealing may be done at a temperature in the range of 200° C. to 400° C. In other embodiments, the temperature can be chosen in the range of 200° C. to 400° C. so that only the SAM material that is attached to the exposed semiconductor region through physisorption can be removed. Thermal annealing done at a temperature higher than 400° C. can risk the removal of SAM material attached through chemisorption to the silicon oxide or silicon nitride, which can be undesirable.

In embodiments, alternatively, extra rinsing of the semiconductor structure in organic solvents such as alcohol and/or acetone and/or water may be applied to remove physisorbed SAM material layer from the exposed part of the semiconductor region (1). In some embodiments, this rinsing may remove the physisorbed SAM precursors, while leaving the chemisorbed SAM present on the second dielectric material (80) and/or the exposed part (11') of the dielectric region (11) of the semiconductor structure (600) unremoved.

In embodiments, the extra rinsing and the thermal annealing may both be applied to remove the physisorbed SAM material layer from the exposed part of the semiconductor region.

Figure 5C:
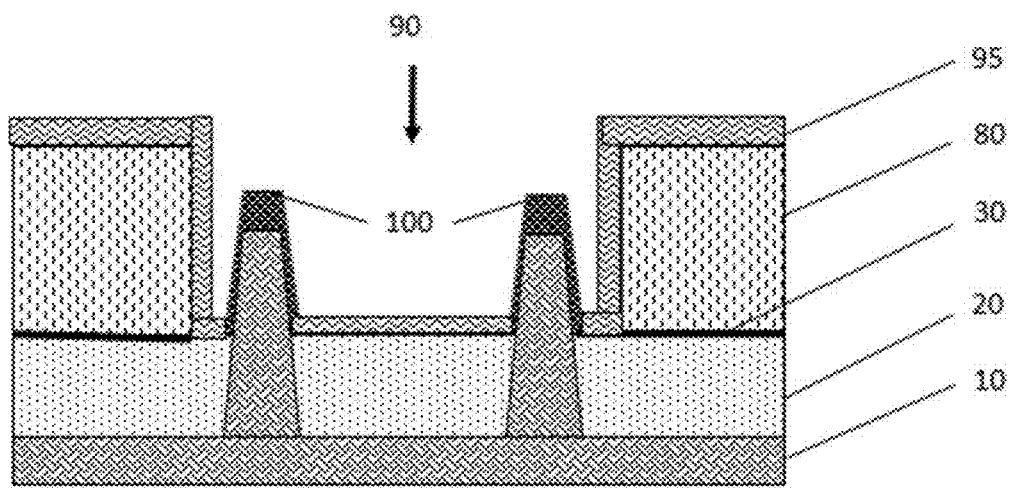
Figure 5D:
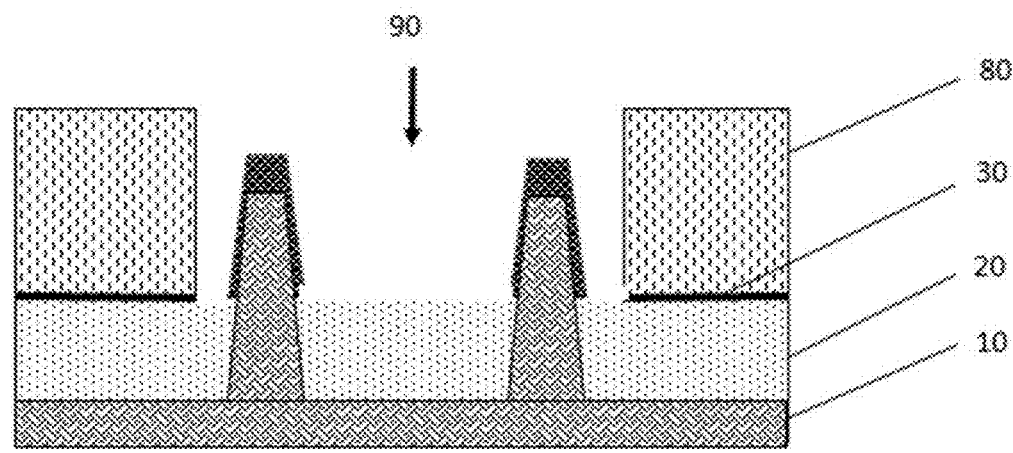
Figure 5E:
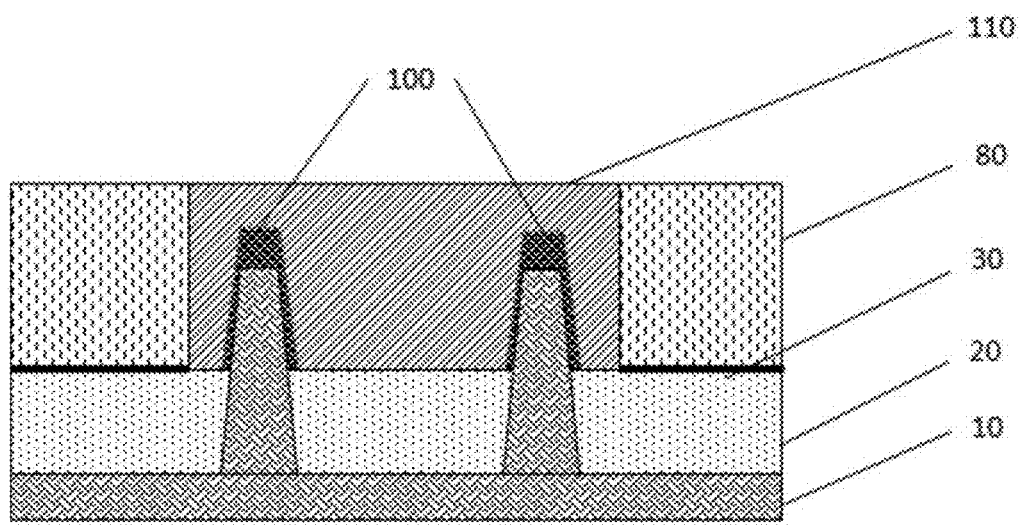

An electrical contact (100) can be formed, at the bottom of the recess (90), conformally on the exposed part of the semiconductor region (FIG. 5(c)). This exposed part of the semiconductor region can be the region that remains uncovered after the SAM is selectively applied on the semiconductor structure.

In some embodiments of the present disclosure, the electrical contact can be formed conformally on the exposed part of the semiconductor region, which is a part of a source region or a drain region of a FET, where the FET can be a finFET. In order to maximize the contacting area so as to reduce the contact resistance, in some embodiments, the electrical contact can be formed conformally everywhere on the exposed part of the semiconductor region.

Furthermore, the choice of the metal of the electrical contact (100) can play a role on the interface resistance. Interface resistance refers to the resistance between the exposed part of the semiconductor region and the metal and it can contribute to the contact resistance. As transistor sizes are reducing, the interface resistance can play a more important role than the resistance of the contact metal (110) in the determination and/or optimization of the contact resistance. Application of a SAM layer gives the opportunity to form the electrical contact (100) not only conformally but also selectively on the exposed part of the semiconductor region. This can open room for providing a selection of the metal and thus, further can make it possible be able to tune the interface resistance.

Particularly, when the source region or drain region is epitaxially grown during the contact formation module, source region or drain region may be diamond shaped. Therefore, in some embodiments, the conformal electrical contact can be formed to a depth that allows contact to the entire source region and drain region, which is highly doped. Contacting the entire source region or drain region refers to the fact that the conformal electrical contact can be formed not only at the top but also laterally on the side of the source region or drain region according to embodiments of the present disclosure. Such kind of an electrical contact can be referred to as a wrap-around contact. Contacting the highly doped source region or drain region from all sides can enable contact resistance minimization since the contact area is maximized.

In embodiments, formation of the electrical contact (100) may comprise selectively depositing a metal on the exposed part of the semiconductor region in the bottom of the recess (90) (not shown in the figures. Following the selective deposition of the metal, a vapor-solid reaction can be performed, whereby the semiconductor structure (600) can be subjected to a silicon-comprising precursor gas or a germanium-comprising precursor gas. Subjecting the semiconductor structure to the silicon-comprising precursor gas or to the germanium-comprising precursor gas can convert the metal to a metal silicide or a metal germanide.

In some embodiments, performing a vapor-solid reaction allows formation of the electrical contact without consuming the substrate. The Si-comprising precursor gas or Ge-comprising precursor gas can react with the metal and the electrical contact formed by conversion of the metal into the metal-silicide or the metal germanide, thus keeping the exposed part of the semiconductor region intact. Since the exposed part of the semiconductor region can be kept intact and not consumed during the formation of the electrical contact, the dopant concentration in this region may not reduced, thus it remains unchanged. Reduction of the dopant concentration during electrical contact formation that may occur if the metal reacts with the exposed part of the semiconductor region leading to increase in contact resistance, is undesirable.

In embodiments, the metal may be nickel. Nickel is typically used for forming electrical contacts to semiconductor structures thanks to its ability to form low resistance electrical contacts.

In embodiments, the selective deposition of the metal may be done in a first deposition tool up to a desired thickness by performing a physical vapor deposition (PVD), sputtering deposition, chemical vapor deposition (CVD) or an atomic layer deposition process (ALD). Attention can be paid to the fact that the deposition temperature of the metal should be kept lower than 400° C. due to the fact that otherwise the SAM material attached to silicon oxide or silicon nitride through chemisorption can risk becoming partially or completely removed.

In some embodiments, selective deposition of the metal may be done by performing an ALD process.

In embodiments, the desired thickness of the metal may be in the range of 2 nm to 80 nm.

In some embodiments, the desired thickness of the metal may be in the range of 4 nm to 10 nm. For thicknesses higher than 10 nm, the risk exists such that the metal deposition may be non-selective; for instance it may also be deposited onto the SAM material.

In embodiments, the vapor solid reaction may be carried out in a second deposition tool at a temperature in the range of 215° C. to 350° C. The second deposition tool may be a chemical vapor deposition (CVD) tool.

In embodiments, the vapor-solid reaction may be carried out at a temperature in the range of 215° C. to 250° C. In these embodiments, the germanium-comprising precursor gas may be used.

In embodiments, the germanium-comprising precursor gas may comprise one or more compounds selected from the group consisting of $GeH_4$, $Ge_2H_6$, trigermane, isobutylgermane, tetramethylgermane and halides of germanium, such as for example $GeCl_4$, $GeF_2$ or $GeBr_2$.

In some embodiments, the temperature may be 225° C. and $GeH_4$ may be used as the Ge-comprising precursor gas. In one embodiment, $GeH_4$ can be used since it is the simplest Ge-comprising precursor gas. The electrical contact formed can be a Ge-comprising alloy. The Ge comprising alloy may be a mono-nickel-germanide (NiGe).

In embodiments, the Ge-comprising precursor gas may be diluted with $H_2$. The diluted Ge-comprising precursor gas may be provided into the second deposition chamber in the presence of a carrier gas.

In embodiments, the carrier gas may be an inert gas. Ar, He or $N_2$ may be used as carrier gas. The purpose of using carrier gas is to regulate the partial pressure of Ge-comprising precursor gas. In one embodiment, the carrier gas is $N_2$.

In embodiments, the flow rate of Ge-comprising precursor gas may be in the range of 100 sccm to 4000 sccm. Pressure of the second deposition tool may be in the range of 1.0 Torr to 6.0 Torr. Exposure time to Ge-comprising precursor gas may be in the range of 15 seconds to 300 seconds.

In alternative embodiments, the vapor-solid reaction may be carried out at a temperature in the range of 225° C. to 350° C. In these alternative embodiments, the silicon-comprising precursor gas may be used.

In embodiments, the silicon comprising precursor gas may be a member selected from halides of Si ($SiCl_4$, $SiBr_4$, $SiCl_2H_2$), tetraethyl orthosilicate (TEOS), hexamethyldisiloxane (HMDSO), tetraethylsilane, pentamethylsilane, hexamethyldisilane, and tetramethylsilane, methylsilane.

In some embodiments, the silicon-comprising precursor gas may be $SiH_4$. The electrical contact formed can be a Si comprising alloy. The Si comprising alloy may be a mono-nickel-silicide (NiSi).

In embodiments, the Si-comprising precursor gas may be diluted with $H_2$. The diluted Si-comprising precursor gas may be provided into the second deposition chamber in the presence of a carrier gas.

In embodiments where the Si-comprising precursor gas may be used, the carrier gas may be an inert gas. Ar, He or $N_2$ may be used as carrier gas.

In embodiments, the flow rate of Si-comprising precursor gas may be in the range of 100 sccm to 900 sccm. Pressure of the second deposition tool may be in the range of 1.0 Torr to 6.0 Torr. Exposure time to Si-comprising precursor gas may be in the range of 15 seconds to 300 seconds.

In embodiments, formation of the electrical contact (100) may comprise selectively depositing a layer stack on the exposed part of the semiconductor region by using an ALD process (not shown in the figures). The layer stack may comprise a metal in contact with the exposed part (1) of the semiconductor region in the bottom of the recess (90) and a metal nitride layer on and in contact with the metal.

In embodiments, the thickness of the metal may be in the range of 1 nm to 5 nm

In embodiments, the thickness of the metal nitride may be in the range of 1 nm to 5 nm In some embodiments, the metal may be Ti which is a good oxygen getter that can avoid residual oxide at the interface between semiconductor region and the metal itself. Presence of residual oxide can adversely influence the contact resistance. Furthermore, Ti can cover the source region or drain region completely.

In some embodiments, the metal nitride may be TiN which can form a good interface between the contact metal and Ti. TiN may be deposited by ALD or by physical vapor deposition (PVD). When deposited by ALD, TiN can be stoichiometric. When deposited by PVD, Ti/N ratio can be tuned, however the layer can be typically Ti-rich.

Following the formation of the conformal electrical contact (100), the self-assembled monolayer (95) material can be removed selectively from the semiconductor structure (600) ((FIG. 5(*d*)). Removing the SAM material (95) selectively may be done by annealing at a temperature higher than 400 C, or by applying plasma and/or UV ozone treatments and/or dipping in wet etching/oxidizing chemistry such as tetramethyl ammonium hydroxide (TMAH), hydrogen fluoride (HF), piranha solution, which is a mixture of hydrogen sulfide and hydrogen peroxide (H2SO4/H2O2).

A contact metal (110) can be provided on the semiconductor structure (600) filling in the recess (90). The contact metal may also be referred to as a contact metal fill in the art.

Typically, the contact metal (110) can be tungsten (W) and it can be deposited by an ALD or a CVD process.

Alternatively, the contact metal (110) may be a Ni-comprising contact metal fill or a Co-comprising contact metal fill. The Ni-comprising contact metal fill or the Co-comprising contact metal fill may be provided by performing an electroplating process.

A CMP process can be performed until a top surface of the second dielectric material (80) is revealed. The CMP process can remove excess contact metal (110) overlaying the semiconductor structure (600), thereby resulting in a flat surface (FIG. 5(*e*)).

The invention claimed is:

1. A method for fabricating a semiconductor structure, the method comprising:
    providing a patterned substrate comprising a semiconductor region and a dielectric region;
    depositing, directly on the patterned substrate, a conformal layer of a first dielectric material thereby covering the semiconductor region and the dielectric region;
    depositing a layer of a sacrificial material on the conformal layer of the first dielectric material;
    patterning the sacrificial material whereby at least a part of the semiconductor region remains covered by the patterned sacrificial material;
    depositing a layer of a second dielectric material on the patterned substrate, thereby completely covering the patterned sacrificial material;
    removing an excess portion of the second dielectric material by performing a surface flattening process, thereby exposing a top surface of the patterned sacrificial material;
    forming a recess in the second dielectric material by completely removing the patterned sacrificial material selectively to the conformal layer, thereby exposing, at its bottom, the conformal layer of the first dielectric material; and
    removing the exposed conformal layer of the first dielectric material selectively to the semiconductor region, thereby, at least exposing the part of the semiconductor region, wherein the exposed part of the semiconductor region is a part of a source region or of a drain region of a field effect transistor.

2. The method according to claim 1, wherein removing the exposed conformal layer of the first dielectric material selectively to the semiconductor region is done by performing a wet etching process.

3. The method according to claim 1, wherein the sacrificial material is an amorphous carbon material or an amorphous silicon material.

4. The method according to claim 1, wherein the depositing of the conformal layer of the first dielectric material is done by Atomic Layer Deposition (ALD).

5. The method according to claim 1, wherein the thickness of the first dielectric material ranges from 1 nm to 10 nm.

6. The method according to claim 5, wherein the thickness of the first dielectric material ranges from 1 nm to 5 nm.

7. The method according to claim 1, wherein the first dielectric material is a metal oxide, a silicon oxide, or a silicon nitride.

8. The method according to claim 7, wherein the silicon nitride is $Si_3N_4$.

9. The method according to claim 7, wherein the metal oxide is aluminum oxide or titanium oxide.

10. The method according to claim 1, wherein the second dielectric material is silicon oxide.

11. A method for forming an electrical contact to a semiconductor structure, the method comprising:
    providing a semiconductor structure prepared by the method comprising:
        providing a patterned substrate comprising a semiconductor region and a dielectric region;
        depositing, directly on the patterned substrate, a conformal layer of a first dielectric material thereby covering the semiconductor region and the dielectric region;
        depositing a layer of a sacrificial material on the conformal layer of the first dielectric material;
        patterning the sacrificial material whereby at least a part of the semiconductor region remains covered by the patterned sacrificial material;
        depositing a layer of a second dielectric material on the patterned substrate, thereby completely covering the patterned sacrificial material;
        removing an excess portion of the second dielectric material by performing a surface flattening process, thereby exposing a top surface of the patterned sacrificial material;
        forming a recess in the second dielectric material by completely removing the patterned sacrificial material selectively to the conformal layer, thereby exposing, at its bottom, the conformal layer of the first dielectric material; and
        removing the exposed conformal layer of the first dielectric material selectively to the semiconductor region, thereby, at least exposing the part of the semiconductor region;
    applying selectively a self-assembled monolayer on the second dielectric material and on an exposed part of the dielectric region of the semiconductor structure, whereby, the exposed part of the semiconductor region remains uncovered;
    forming an electrical contact on the exposed part of the semiconductor region, at the bottom of the recess; and
    selectively removing the self-assembled monolayer.

12. The method according to claim 11, wherein forming the electrical contact comprises:
    depositing selectively a metal on the exposed part of the semiconductor region at the bottom of the recess, and;
    performing a vapor-solid reaction, whereby the semiconductor structure is subjected to a silicon-comprising precursor gas or a germanium-comprising precursor gas, thereby converting the metal to respectively a metal silicide or a metal germanide.

13. The method according to claim 11, wherein forming the electrical contact comprises depositing a layer stack by using an Atomic Layer Deposition (ALD) process, wherein the layer stack comprises a metal layer in contact with the exposed part of the semiconductor region at the bottom of the recess and a metal nitride layer on and in contact with the metal layer.

14. The method according to claim 11, wherein the electrical contact is a wrap-around contact.

15. The method according to claim 12, wherein the metal is nickel.

16. The method according to claim 12, wherein the germanium-comprising precursor gas is a member selected from the group consisting of $GeH_4$, $Ge_2H_6$, trigermane, isobutylgermane, tetramethylgermane and halides of germanium.

17. The method according to claim 12, wherein the silicon-comprising precursor gas is a member selected from the group consisting of halides of Si, tetraethyl orthosilicate (TEOS), hexamethyldisiloxane (HMDSO), tetraethylsilane, pentamethylsilane, hexamethyldisilane, and tetramethylsilane, and methylsilane.

18. The method according to claim 13, wherein the metal layer is a titanium layer.

19. The method according to claim 13, wherein the metal nitride layer is a TiN layer.

* * * * *